United States Patent
Chen

(10) Patent No.: US 9,047,953 B2
(45) Date of Patent: Jun. 2, 2015

(54) MEMORY DEVICE STRUCTURE WITH PAGE BUFFERS IN A PAGE-BUFFER LEVEL SEPARATE FROM THE ARRAY LEVEL

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 119 days.

(21) Appl. No.: 13/973,774

(22) Filed: Aug. 22, 2013

(65) Prior Publication Data

US 2015/0055414 A1 Feb. 26, 2015

(51) Int. Cl.
| | |
|---|---|
| G11C 16/16 | (2006.01) |
| G11C 16/04 | (2006.01) |
| H01L 27/115 | (2006.01) |
| G11C 16/10 | (2006.01) |

(52) U.S. Cl.
CPC ...... *G11C 16/0483* (2013.01); *H01L 27/11578* (2013.01); *G11C 16/10* (2013.01); *G11C 16/16* (2013.01)

(58) Field of Classification Search
CPC ...... G11C 16/16; G11C 16/10; G11C 16/102; G11C 16/26
USPC .............. 365/185.33, 185.17, 185.11, 189.05
See application file for complete search history.

(56) References Cited

U.S. PATENT DOCUMENTS

| | | | |
|---|---|---|---|
| 8,363,476 B2 | 1/2013 | Lue et al. | |
| 2010/0322000 A1* | 12/2010 | Shim et al. | ............... 365/185.03 |
| 2012/0182804 A1 | 7/2012 | Hung et al. | |
| 2012/0182806 A1 | 7/2012 | Chen et al. | |

OTHER PUBLICATIONS

Jung et al., "Three Dimensionally Stacked NAND Flash Memory Technology Using Stacking Single Crystal Si Layers on ILD and TANOS Sructure for Beyond 30nm Node," IEEE IEDM, Dec. 11-13, 2006, 4 pages.
Lai et al., "A Multi-Layer Stackable Thin-Film Transistor (TFT) Nand-Type Flash Memory", IEEE Int'l Electron Devices Meeting, Dec. 11-13, 2006.
U.S. Appl. No. 13/721,523 entitled Memory Device Structure With Decoders in a Device Level Separate From the Array Level filed Dec. 20, 2012, 28 pages.

* cited by examiner

*Primary Examiner* — Jason Lappas
(74) *Attorney, Agent, or Firm* — Haynes Beffel & Wolfeld LLP

(57) ABSTRACT

A structure of a memory device and a method for making the memory device structure are described. The memory device includes an array of memory cells in an array level die. The array comprises a plurality of sub-arrays. Each of the sub-arrays comprises respective data lines. The memory device also includes page buffers for corresponding sub-arrays in a page-buffer level die. The memory device also includes inter-die connections that are configured to electrically couple the page buffers in the page-buffer level die to data lines of corresponding sub-arrays in the array level die.

16 Claims, 12 Drawing Sheets

MEMORY DEVICE STRUCTURE WITH PAGE BUFFERS IN A PAGE-BUFFER LEVEL SEPARATE FROM THE ARRAY LEVEL

TECHNICAL FIELD

This disclosure generally relates to memory devices.

DESCRIPTION OF RELATED ART

Memory devices such as NAND flash memory devices utilize memory cells arranged in an array to store data. Operations can be performed on specific memory cells in the array of memory cells through the use of an address decoder that selects specific word lines and bit lines in the array. Data in the memory cells in the array can be accessed through input-output circuits and a page buffer coupled to bit lines in the array. In typical memory device structures, the address decoder is disposed adjacent to one side of the array of memory cells. The page buffer is disposed adjacent to another side of the array of memory cells. Other peripheral circuits such as input-output circuits are disposed in peripheral regions around the address decoder, the page buffer, and the array of memory cells. To provide high data rate, a large number of bit lines in parallel are disposed on top of the array of memory cells, coupling selected memory cells to the page buffer.

To achieve high memory density, designers have been looking to techniques for stacking multiple levels of memory cells to create a three-dimensional (3D) memory array to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE International Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE International Electron Devices Meeting, 11-13 Dec. 2006.

Design rules are often relaxed in order to pattern multiple levels of memory cells in a 3D memory array. The relaxed design rules such as a wider minimal pitch between parallel bit lines can reduce the number of bit lines coupling selected memory cells to the page buffer, thus reducing data rate for the 3D memory array.

To overcome the relaxed design rules and improve data rate, a 3D memory array can be divided into sub-arrays of 3D memory cells. Each sub-array has its own dedicated page buffer disposed adjacent to the corresponding sub-array. However, such memory device structure requires a larger area for the page buffers and reduces the available area for memory cells for a given die size.

It is desirable to provide a technology for a memory device structure to facilitate integration of a 3D memory array and improve data rate of the 3D memory array, while without reducing the available area for the 3D memory array for a given die size.

SUMMARY

The present technology provides a structure of a memory device and a method for making the memory device structure. The memory device includes an array of memory cells in an array level die. The array comprises a plurality of sub arrays. The memory device also includes page buffers for corresponding sub-arrays in a page-buffer level die. Inter-die connections are configured to electrically couple the page buffers in the page-buffer level die to data lines of corresponding sub-arrays in the array level die.

Other aspects and advantages of the present technology can be seen on review of the drawings, the detailed description and the claims, which follow.

DETAILED DESCRIPTION

A detailed description of embodiments of the present technology is provided with reference to the Figures.

Figure 1:
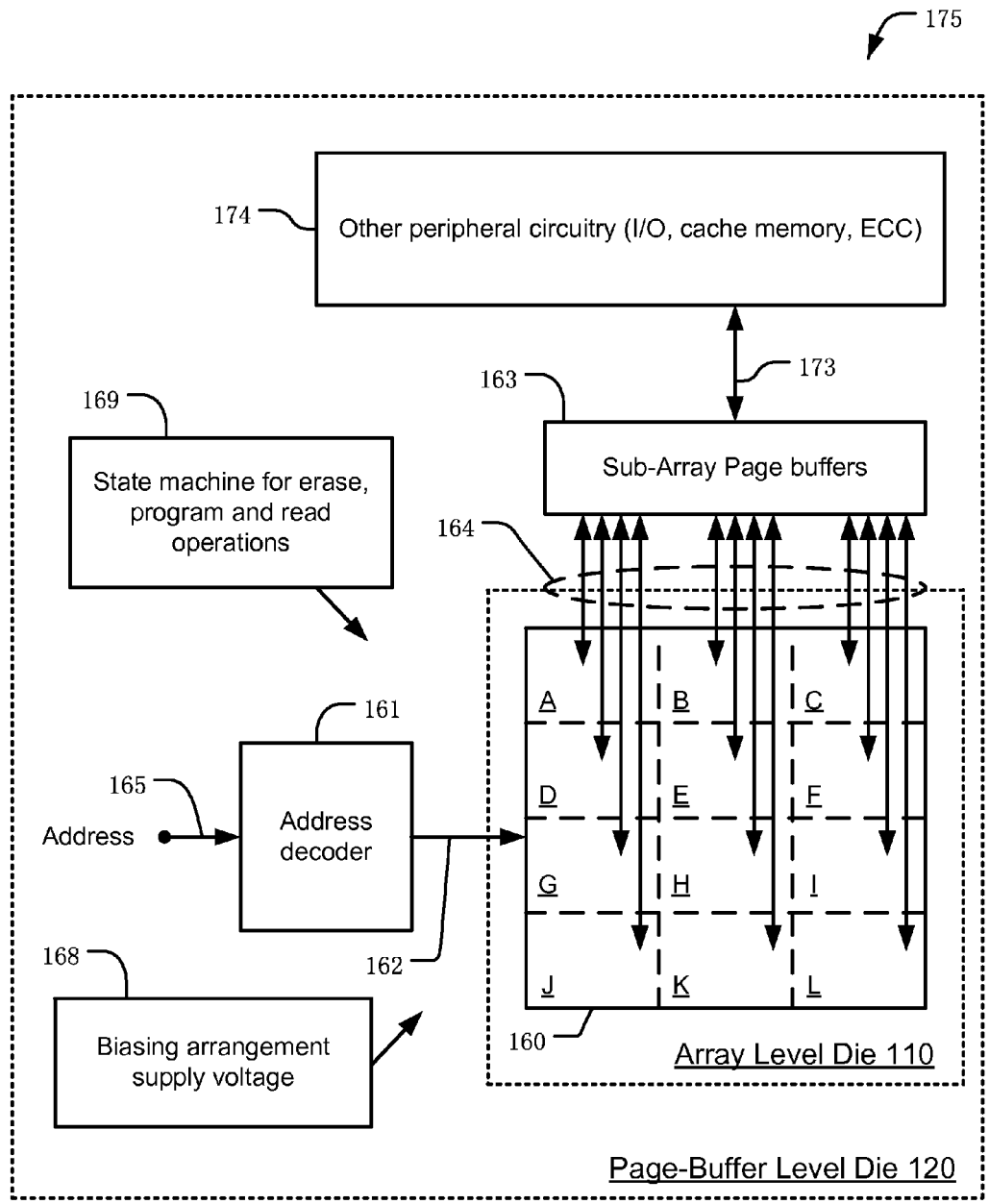
FIG. 1 is a simplified block diagram of an example memory including a 3D NAND flash memory array on an array die, and peripheral circuitry including sub-array page buffers on a page-buffer level die.

FIG. 1 is a simplified block diagram of an example memory 175 including a 3D NAND flash memory array 160 on an array die 110, and peripheral circuitry including sub-array page buffers 163 on a page-buffer level die 120. The array 160 includes a plurality of sub-arrays (A-L) of memory cells. Each sub-array can include multiple 3D memory cell blocks. Each 3D block includes multiple levels of memory cells. In the illustration, the array level die 110 is illustrated schematically as part of a flat block diagram. However, embodiments of the technology described in more detail below arrange the array level die 110 and the page-buffer level die 120 in a stacked configuration.

An address decoder 161 on the page-buffer level die 120 is coupled to the array 160 via lines 162. Addresses are supplied on bus 165 to the address decoder 161. The address decoder 161 can include word-line decoder, bit-line decoder, and other suitable decoders that decode the supplied addresses and select corresponding memory cells in the array 160. In some embodiments, all or part of the address decoder 161 can be disposed on the array level die 110.

Data lines in the sub-arrays A-L are connected by inter-die connectors 164 to sub-array page buffers 163 on the page-buffer level die 120, which in turn are coupled to other peripheral circuitry 174 via lines 173.

Peripheral circuitry includes circuits that are formed using logic circuits or analog circuits that are not part of the memory cell sub-arrays, such as the address decoder 161, state machine 169, biasing arrangement supply voltage block 168, and so on. Such peripheral circuitry is often composed of circuit elements, like CMOS transistors for example, which can be made efficiently using a manufacturing process that is different than that used for the memory array 160. In this example, the block 174 labeled other peripheral circuitry can include input-output (I/O) circuits, cache memory, error-code-correction (ECC) circuit, and other circuit components on the memory 175, such as a general purpose processor or special-purpose application circuitry, or a combination of modules providing system-on-a-chip functionality supported by the array 160. Data is supplied via the lines 173 to I/O ports or to other data destinations internal or external to the page-buffer level die 120. Data to and from the array 160 can be stored (cached) in the cache memory. The ECC circuit can perform ECC functions (e.g., parity check) on the cached data to ensure integrity of the data to and from the array 160.

A controller, implemented in this example as a state machine 169, provides signals to control the application of bias arrangement supply voltage generated or provided through the voltage supply or supplied in block 168 to carry out the various operations described herein. These operations include erase, program, and read operations for the array 160 that can utilize different bias conditions. The controller is coupled to the address decoder 161, the page buffers 163, and the other peripheral circuitry 174. The controller can be implemented using special-purpose logic circuitry as known in the art. In other embodiments, the controller comprises a general-purpose processor, which may be implemented on the same memory 175, which executes a computer program to control the operations of the device. In yet other embodiments, a combination of special-purpose logic circuitry and a general-purpose processor may be utilized for implementation of the controller.

Each sub-array page buffer 163 is coupled to data lines of corresponding sub-array in the memory array 160, and can include one or more storage elements (e.g., latches) for each data line connected to the sub-array. The controller 169 can cause the address decoder 161 (or other switches) to couple one or more specific memory cells in the array 160 to the sub-array page buffers 163, and cause the sub-array page buffers 163 to store data that is written to or read from these specific memory cells.

The page width of a sub-array, or the number of bits to or from the sub-array that can be stored in parallel in the sub-array's corresponding page buffer, can be the number of data lines of the sub-array. The array page width of the memory array 160 is the sum of the page widths of all the sub-arrays (sub-arrays A-L) of the memory array 160. Alternatively, the array page width can be the sum of any number greater than one of the sub-array page widths, such as 2, 4, 8 and so on. For example, if the page width of each of twelve sub-arrays A-L is 3 bits, the array page width of a memory array 160 160 can be 3×12=36 bits.

Figure 2:
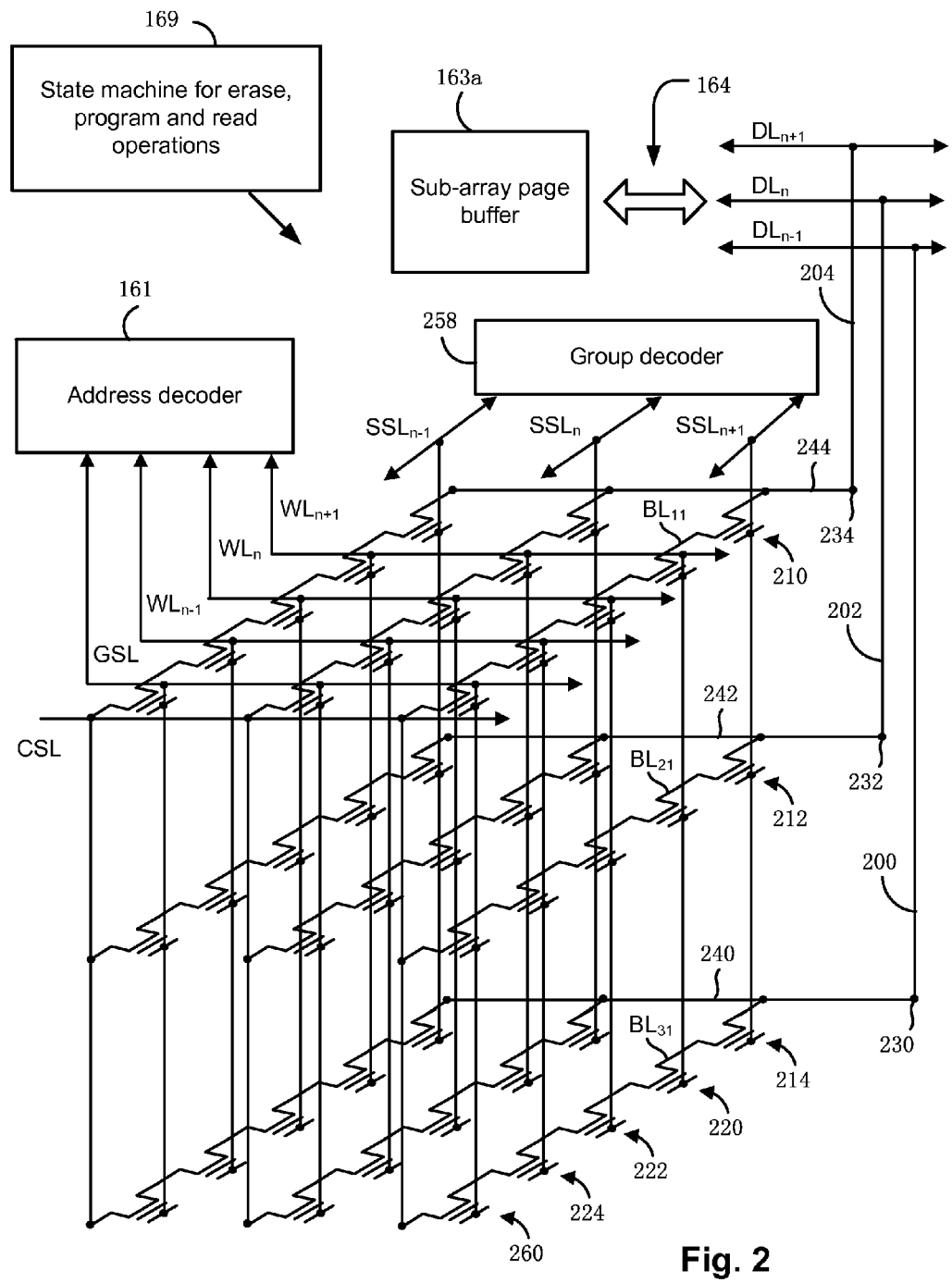
FIG. 2 is a schematic diagram of a portion of an example sub-array of the memory array on the array level die illustrated in FIG. 1.

FIG. 2 is a schematic diagram of a portion of an example sub-array of the memory array 160 on the array level die 110 illustrated in FIG. 1. In this example three levels of memory cells are illustrated, which is representative of a 3D block of memory cells that can include many levels of memory cells.

The 3D block of memory cells of the example sub-array is formed on the array level die 110.

A plurality of word lines including word lines $WLn_{-1}$, $WLn$, $WLn_{+1}$ extend in parallel along a first direction of the 3D memory cell block. The word lines are in electrical communication with the address decoder 161. The word lines are connected to the gates of the memory cells, which are arranged in series as NAND strings. Word line WLn is representative of the word lines. As shown in FIG. 2, the word line WLn is vertically connected to the gates of the memory cells in each of the various levels (in a second direction perpendicular to the first direction) underlying the word line WLn.

A plurality of local bit lines is arranged along columns (in a third direction perpendicular to the first and second directions) to form NAND strings in the various levels of the 3D memory cell block. As shown in FIG. 2, the 3D memory cell block includes a local bit line BL31 on the third level, a local bit line BL21 on the second level, and local bit line BL11 on the first level. The memory cells have dielectric charge trapping structures between the corresponding word lines and the corresponding local bit lines. In this illustration, there are three memory cells in a NAND string for simplicity. For example, a NAND string formed by local bit line BL31 on the third level comprises memory cells 220, 222, 224. In a typical implementation, a NAND string may comprise 16, 32 or more memory cells.

A plurality of string select lines including string select lines $SSLn-1$, $SSLn$, $SSLn_{+1}$ are in electrical communication with group decoder 258 (which could be part of the address decoder 161), which selects a group of strings of the 3D memory cell block. The string select lines are connected to the gates of string select transistors arranged at the first ends of the memory cell NAND strings. As shown in FIG. 2, each of the string select lines are vertically connected to the gates of a column of the string select transistors in each of the various levels in the 3D memory cell block. For example, string select line $SSLn_{+1}$ is connected to the gates of string select transistors 210, 212, 214 in the three levels.

The local bit lines on a particular level are selectively coupled to an extension on the particular level by the corresponding string select transistors. For example, the local bit lines on the third level are selectively coupled to extension 240 by the corresponding string select transistors in that level. Similarly, the local bit lines on the second level are selectively coupled to extension 242, and local bit lines on the first level are selectively coupled to extension 244.

The extensions on each of the levels include a corresponding contact pad for contact with a vertical connector coupled to a corresponding data line or top-level bit line of the example sub-array including the 3D memory cells block shown in FIG. 2. For example, extension 240 in the third level is coupled to a data line $DLn_{-1}$ via contact pad 230 and vertical connector 200. Extension 242 on the second level is coupled to a data line DLn via contact pad 232 and vertical connector 202. Extension 244 on the third level is coupled to a data line $DLn_{+1}$ via contact pad 234 and vertical connector 204. Similarly, the data lines $DLn_{-1}$, $DLn$, and $DLn_{+1}$ are also connected to local bit lines of other 3D memory cell blocks (now shown) of the example sub-array with respective extensions, contact pads, and vertical connections of the other 3D blocks.

The data lines $DLn_{-1}$, $DLn$, and $DLn_{+1}$ are formed on top of the 3D memory cell block in the array level die 110. The data lines $DLn_{-1}$, $DLn$, and $DLn_{+1}$ are coupled to the example sub-array's corresponding sub-array page buffer 163a in the page-buffer level die 120 (a corresponding one of the sub-array page buffers 163 illustrated in FIG. 1) via inter-die connectors 164, allowing for wide, and parallel read and write operations. In this manner a 3D decoding network is established, in which a page of selected memory cells is accessed using one word line, one string selected line, and the data lines $DLn_{-1}$, $DLn$, and $DLn_{+1}$. The data lines $DLn_{-1}$, $DLn$, and $DLn_{+1}$ in some embodiments can comprise contact pads, or lines on the memory level die that are routed to an array of contact pads, for inter-die connectors located over the sub-array, and may not extend in parallel lines across the sub-array.

Block select transistors are arranged at the second ends of the NAND strings of the 3D memory cell block. For example, block select transistor 260 is arranged at the second end of the NAND string formed by memory cells 220, 222, 224 (i.e., local bit line BL31). A ground select line GSL is connected to the gates of the block select transistors. The ground select line GSL is in electrical communication with the word-line decoder 261 to receive bias voltages during operations described herein.

The block select transistors are used to selectively couple second ends of all the NAND strings in the 3D memory cell block to a reference voltage provided on common source line CSL. The common source line CSL is in electrical communication with the address decoder 261 to receives bias voltages from the bias circuit (not shown here) during operations described herein. In some operations described herein, the CSL is biased to a reference voltage that is higher than that of a bit line coupled to the opposite end of a NAND string, rather than in the more traditional "source" role at or near ground.

Figure 3:
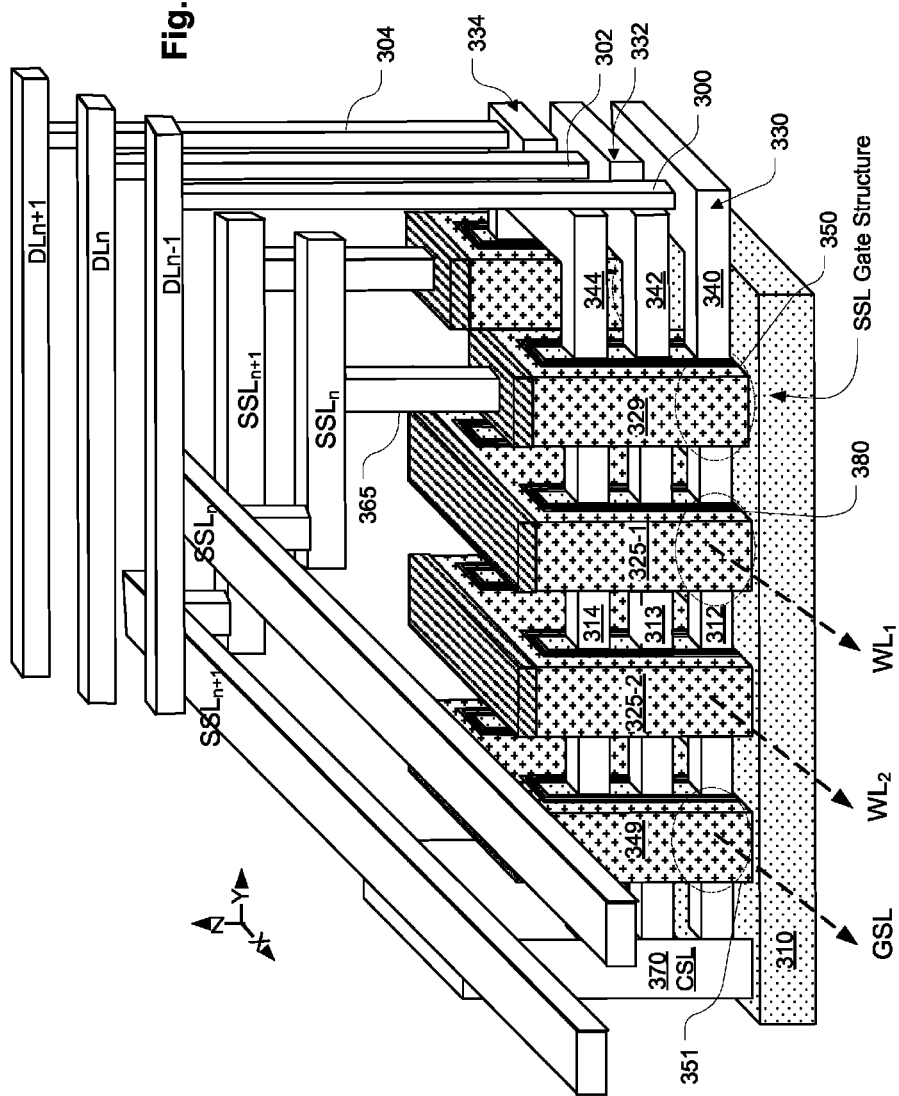
FIG. 3 is a perspective view of a portion of an example sub-array of the memory array on the array level die illustrated in FIG. 1.

FIG. 3 is a perspective view of a portion of an example sub-array of the memory array 160 on the array level die 110 illustrated in FIG. 1. In FIG. 3, fill material has been removed to give a view of the word lines and local bit lines that make up a 3D memory cell block as described in FIG. 2.

The 3D memory cell block is formed on an insulating layer 310 over the substrate of the array level die 110 illustrated in FIG. 1. The 3D memory cell block includes a plurality of conductive lines 325-1, 325-2, acting as the word lines $WL_1$, $WL_2$, and arranged for connection to the word-line decoder. A layer of silicide can be formed on the top surfaces of the conductive lines 325-1, 325-2.

The conductive lines 325-1, 325-2 are conformal with semiconductor material strips acting as the local bit lines in the various levels. For example, semiconductor material strip 312 acts as a local bit line in the third level, semiconductor material strip 313 acts as a local bit line in the second level, and semiconductor material strip 314 acts as a local bit line in the first level. The semiconductor material strips are separated by insulating layers (not shown).

The semiconductor material strips 312, 313, 314 can be an intrinsic semiconductor material. In alternatives, the semiconductor material strips 312, 313, 314 can be doped semiconductor materials. The conductive lines 325-1, 325-2 can be a doped semiconductor material, or other conductive word line material. For example, the semiconductor material strips can be made using intrinsic polysilicon, or intrinsic single crystal silicon, while the conductive lines 325-1, 325-2 can be made using relatively heavily doped p+-type polysilicon.

The memory cells have charge storage structures between the conductive lines 325-1, 325-2 and the semiconductor material strips acting as the local bit lines. For example, memory cell 380 is formed between conductive line 325-1 and semiconductor material strip 312 acting as a local bit line in the third level. In this illustration, there are two memory cells in a NAND string for simplicity. In the embodiment described here, each memory cell is a double gate field effect transistor having active charge storage regions on both sides of the interface between the corresponding semiconductor material strip and the conductive lines 325-1, 325-2.

String select lines SSLn, SSLn+1 are connected to gates of string select transistors at the first ends of the memory cell NAND strings of the 3D memory cell block. The string select transistors are formed between the semiconductor material strip of the corresponding NAND string and a multi-level string select gate structure. For example, string select transistor 350 is formed between the semiconductor material strip 312 and the string select gate structure 329. The string select gate structure 329 is coupled to the string select line SSLn via contact plug 365.

The semiconductor material strips (the local bit lines) are selectively coupled to the other semiconductor material strips in the same level by extensions. For example, the semiconductor material strips in the third level are selectively coupled to one another via extension 340. Similarly, the semiconductor material strips in the second level are selectively coupled to one another extension 342, and the semiconductor material strips in the first level are selectively coupled to extension 344.

Extension 340 in the third level is coupled to a data line $DLn_{-1}$ via contact pad 330 and vertical connector 300. Extension 342 in the second level is coupled to a data line DLn via contact pad 332 and vertical connector 302. Extension 344 on the third level is coupled to a data line $DLn_{+1}$ via contact pad 334 and vertical connector 304.

The data lines $DLn_{-1}$, $DLn$, and $DLn_{+1}$ are coupled to other 3D memory cell blocks (not shown) that are part of a multi-block sub-array, and connected to the sub-array's corresponding sub-array page buffer 163a in the page-buffer level die 120 via inter-die connectors (represented by arrow 164), as described in more detail below in FIG. 4A. In other examples, a sub-array may comprise a single block, and the data lines $DLn_{-1}$, $DLn$, and $DLn_{+1}$ may provide contact pads for the inter-die connectors.

Block select transistors are arranged at the second ends of the NAND strings of the 3D memory cell block. For example, block select transistor 351 is arranged at the second end of the NAND string formed by semiconductor material strip 312. Gate structure 349, acting as ground select line GSL, is connected to the gates of the block select transistors.

The block select transistors are used to selectively couple second ends of all the NAND strings in the 3D memory cell block to a reference voltage provided on common source line CSL 370. CSL 370 extends parallel with the word lines.

The structure illustrated in FIG. 3 can be characterized as a 3D Vertical Gate (3DVG) architecture. One configuration for a 3D Vertical Gate (3DVG) architecture is described in U.S. Patent Application Publication No. 2012/0182806 filed 1 Apr. 2011, entitled Memory Architecture Of 3D Array With Alternating Memory String Orientation And String Select Structures, by inventors Shih-Hung Chen and Hang-Ting Lue, which is incorporated by reference as if fully set forth herein.

In other embodiments, the semiconductor strips can be configured as word lines, with vertical bit lines between the strips for vertical NAND string configurations. See for example, commonly owned U.S. Pat. No. 8,363,476, issued 29 Jan. 2013 (filed 19 Jan. 2011), entitled Memory Device, Manufacturing Method And Operating Method Of The Same, by inventors Hang-Ting Lue and Shi-Hung Chen, which is incorporated by reference as if fully set forth herein.

Figure 4A:
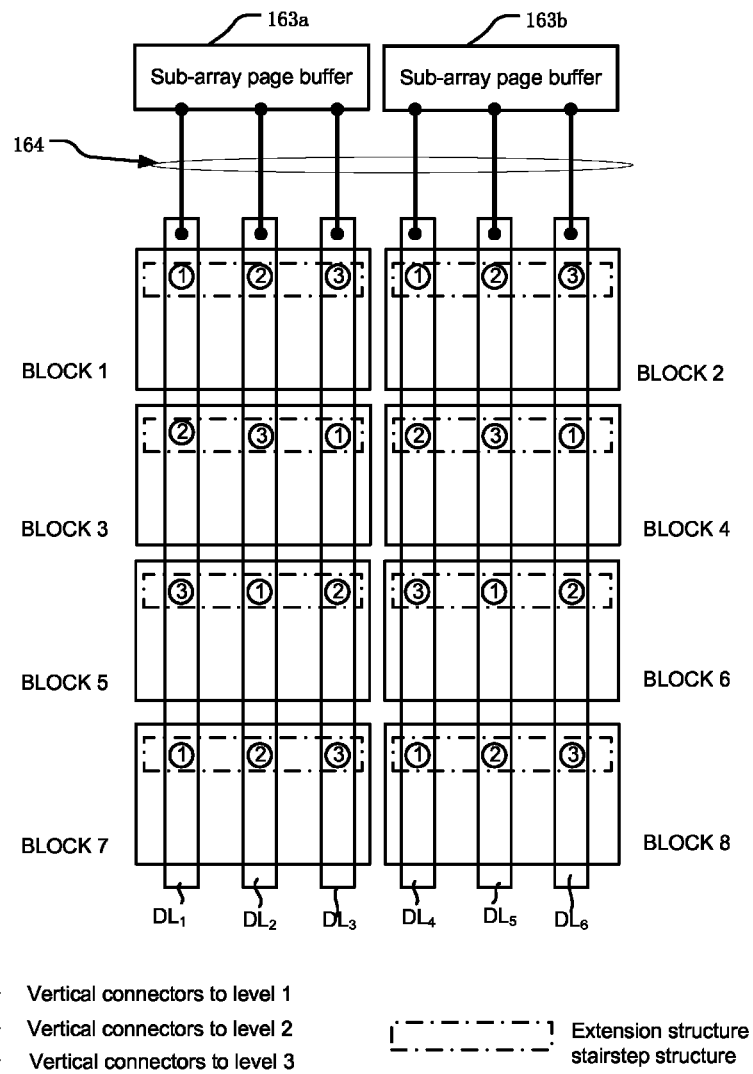
FIG. 4A is a layout view of connections of data lines of an example sub-array of the memory array on the array level die illustrated in FIG. 1.

FIG. 4A is a layout view of connections of example multi-block sub-arrays of the memory array 160.

Each of the eight 3D memory cell blocks (BLOCK 1 to BLOCK 8) of the sub-array 400 comprises a plurality of levels including respective two dimensional arrays of memory cells. Each two dimensional array of memory cells includes a plurality of word lines and a plurality of local bit lines coupled to corresponding memory cells in the array. The two dimensional arrays may for example be implemented in a NAND configuration as described above. Alternatively, other array configurations may be used.

The block size of each of 3D memory cell blocks will vary from embodiment to embodiment. In some embodiments, the size of each of the 3D memory cell blocks can be for example 2 KB (kilobytes), 4 KB, 8 KB, or 16 KB.

The sub-array 400 is formed on the array level die 100. As illustrated by data lines $DL_1$ to $DL_6$ in FIG. 4A, data lines of the sub-array 400 are coupled to the local bit lines (not shown) in the various levels of the 3D memory cell blocks via vertical connectors. In this illustration, each of blocks 1-8 of the sub-array 400 includes three levels for simplicity. For example, each block is the 3D memory cells block illustrated in FIG. 3. The level at which a vertical connector couples to the overlying data line is indicated by the level indices 1, 2, or 3. For example, the data line $DL_1$ is coupled via a level 1 to local bit lines within a first level of the memory block 1, coupled via a level 2 to local bit lines within a second level of the memory block 3, coupled via a level 3 connector to local bit lines within a third level of the memory block 5, and coupled via a level 1 connector to local bit lines within a first level of the memory block 7.

The vertical connectors for each block in this example are disposed within a region labeled "extension structure to local bit lines," which can be implemented by arranging contact pads in each level in a stair step manner like that illustrated in FIG. 3 with vertical connectors 300, 302, 304, and contact pads 330, 332, and 334.

The data lines $DL_1$ to $DL_6$ of the sub-array 400 are coupled to the sub-array's corresponding sub-array page buffer 163a, 163b on the page-buffer level die 120 (a corresponding one of the sub-array page buffers 163 illustrated in FIG. 1) via inter-die connectors 164. The sub-array page width is 3 bits (i.e., the total number of data lines coupled to a memory block) in this example. The data lines $DL_1$ to $DL_6$ can be shared among blocks in a column of blocks by using block select switches or other decoding elements. Thus, in this example, BLOCK 1, BLOCK 3, BLOCK 5, and BLOCK 7 share a sub-array page buffer 163a. Likewise, BLOCK 2, BLOCK 4, BLOCK 6, and BLOCK 8 share a sub-array page buffer 163b.

Figure 4B:
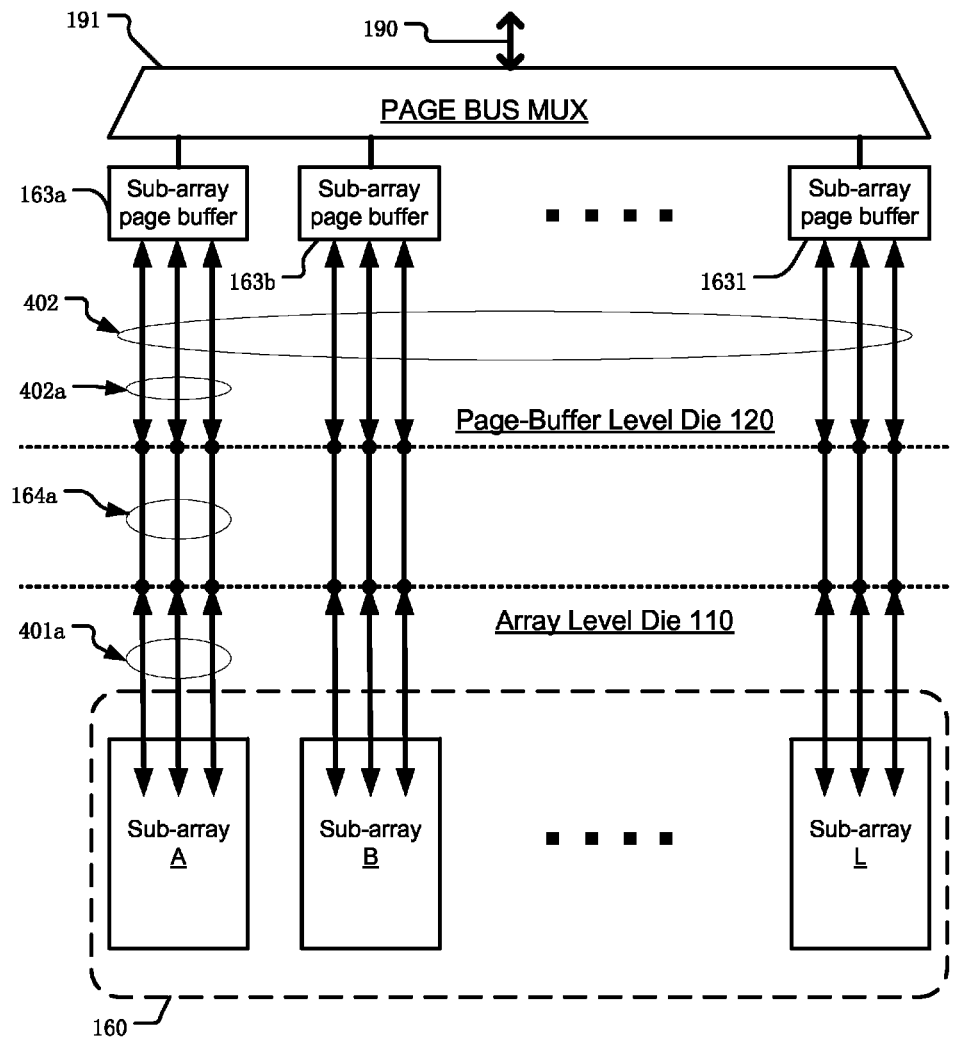
FIG. 4B is a schematic diagram illustrating data connections between sub-arrays on an array level die and page buffers on a page-buffer level die.

FIG. 4B is a schematic diagram illustrating data connections between sub-arrays of the memory array 160 on the array level die 110 and the page buffers on the page-buffer level die 120. The memory array 160 includes twelve sub-arrays (A-L). As illustrated in FIG. 4A, data lines of each sub-array on the array level die 110 are coupled to the sub-array's corresponding page buffer on the page-buffer level die 120 via inter-die connectors. For example, sub-array A's three data lines 401a are coupled to the corresponding page buffer 163a via inter-die connectors 164a. More particularly, the data lines of the twelve sub-arrays are coupled (via the inter-die connectors) to an array page width bus 402 in the page-buffer level die 120, connecting to the corresponding twelve page buffers. The array page width bus 402 includes twelve segments. Each segment (e.g., 402a) corresponds to data connection between a sub-array (e.g., sub-array A) and its corresponding page buffer (e.g., 163a), and has the same width as the page width of the sub-array (3-bits).

In some embodiments, the outputs of the sub-array page buffers 163a to 163l are connected to a page bus multiplexer 191, which drives a page width bus 190 on the page buffer level die 120, having a width of less than all twelve segments, such as a width of six segments, and which can connect to I/O circuitry, and other peripheral circuitry. Alternatively, the connections between the sub-array page buffers 163a to 163l and page bus multiplexer 191, which drives a page width bus 190 can be inter-die connections where the page bus multiplexer 191 is disposed on a separate die.

Figure 5A:
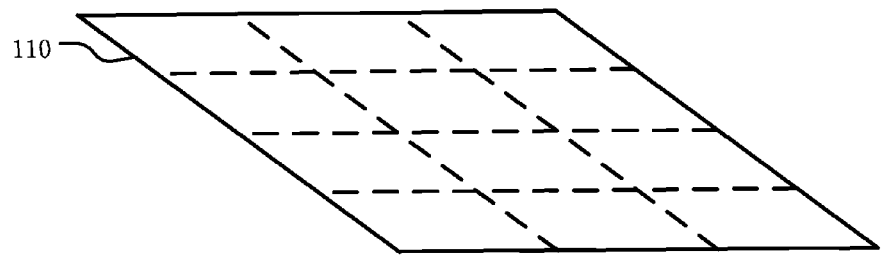
FIG. 5A represents a layout of a memory array disposed on the array level die illustrated in FIG. 1.

FIG. 5A represents a layout of a memory array 160 disposed on the array level die 110 such as illustrated in FIG. 1. The array level die 110 includes 12 sub-array areas (indicated by the dash-line divisions) for corresponding sub-arrays (A-L). Each sub-array area encompasses a corresponding sub-array. The sub-array area includes sub-array's 3D memory cell blocks formed on the array level die 110 and data lines or data line contacts disposed on top of the 3D memory cell blocks, as described in FIGS. 3 and 4.

Figure 5B:
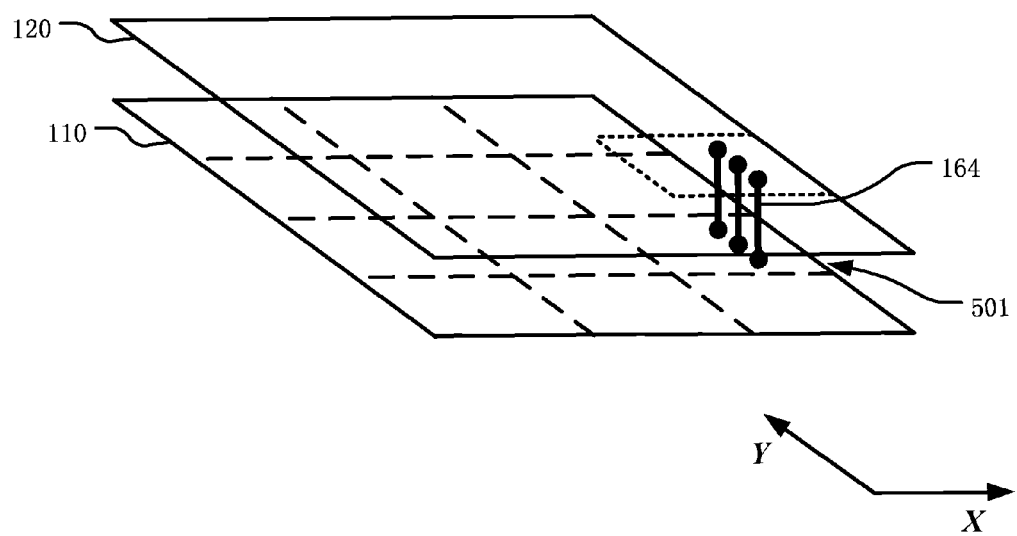
FIG. 5B represents a stack of the page-buffer level die and the array level die illustrated in FIG. 1.

FIG. 5B represents a stack of the page-buffer level die 120 and the array levels die 110 illustrated in FIG. 1. As illustrated in 5B, the page-buffer level die 120 is disposed on top of the array level die 110. Page buffers corresponding to the sub-arrays in the array level die 110 are formed in the page-buffer level die 120. Data lines of a sub-array in array level die 110 and the sub-array's corresponding page buffer in page-buffer level die 120 are electrically coupled with inter-die connectors 164. Here, only inter-die connectors 164 of a particular sub-array (indicated by its sub-array area 501) of the memory array 160 are shown. As illustrated, the inter-die connectors can be disposed over the sub-array areas in which they are connected to corresponding sub-arrays. Also the sub-array page buffers can be disposed in an area on the page-buffer level die 120 that overlies the corresponding sub-array on the array level die 110.

Figure 5C:
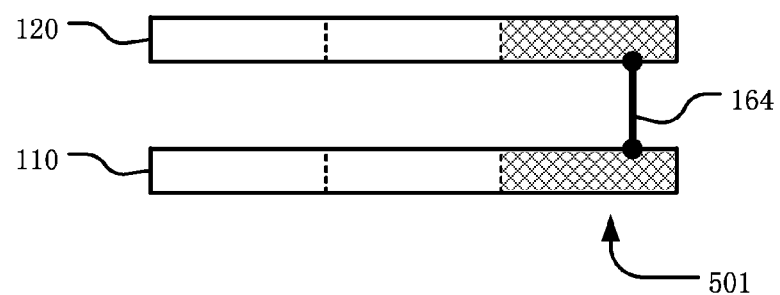
FIGS. 5C and 5D are side views of the stack of page-buffer level die and array level die illustrated in FIG. 5B.
Figure 5D:
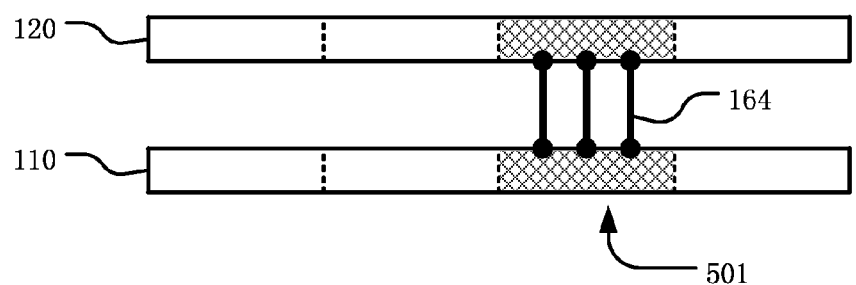

FIGS. 5C and 5D are side views of the stack of page-buffer level die 120 and array level die 110 illustrated in FIG. 5B. FIGS. 5C is the side view from the y-direction shown in FIG. 5B. FIG. 5D is the side view from the x-direction shown in FIG. 5B. The shaded section of the array level die 110 in FIGS. 5C and 5D corresponds to the sub-array area 501 for the particular sub-array illustrated in FIG. 5B. The shaded section of the page-buffer level die 120 in FIGS. 5C and 5D corresponds to an area encompassing corresponding page buffer for the particular sub-array. More particularly, inter-die connectors 164 connect the corresponding sub-array page buffer for the particular sub-array to data lines of the particular sub-array at locations within the sub-array area (501) for the particular sub-array. In some embodiments, the inter-die connectors 164 comprise through silicon vias (TSVs). In another embodiment, the inter-die connectors 164 comprise conducting wires or tubes disposed around edges of the page-buffer level die 120. In yet another embodiment, the array level die 110 and the page-buffer level die 120 are stacked in a flip-chip configuration; the inter-die connectors 164 comprise C4 (controlled collapse chip connection) bumps coupling the page buffers in the page-buffer level die 120 to the data lines of corresponding sub-arrays in the array level die 110.

Figure 6:
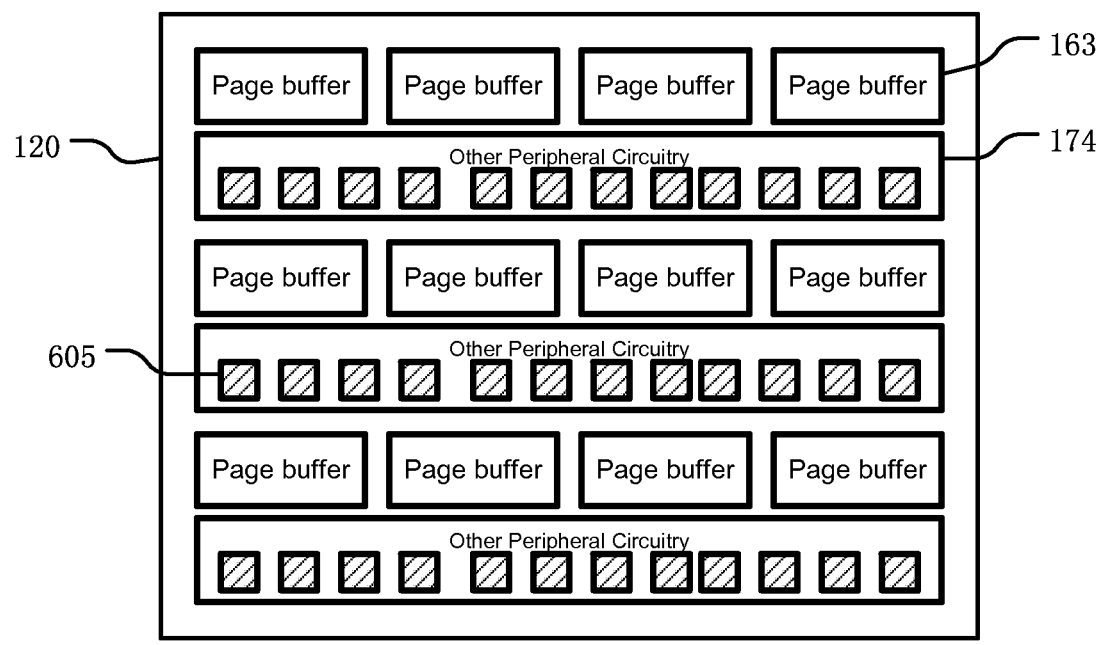
FIG. 6 is an example layout of the page-buffer level die illustrated in FIG. 5B.

FIG. 6 is an example layout of the page-buffer level die 120 illustrated in FIG. 5B. The page buffer die 120 includes sub array page buffers 163 that are coupled to respective sub-arrays formed in the array level die 110 with respective inter-die connectors 164 (e.g., as illustrated in the perspective view of FIG. 5B and the side views of FIGS. 5C and 5D). The page-buffer level die 120 also includes other peripheral circuitry 174 and contact pads 605 (shaded boxes). The contact pads 605 provides for connections (e.g., with bonding wires or C4 bumps) to circuitry external to the stack of the page-buffer level die 120 and the array level die 110 illustrated in FIGS. 5B-5D.

Figure 7A:
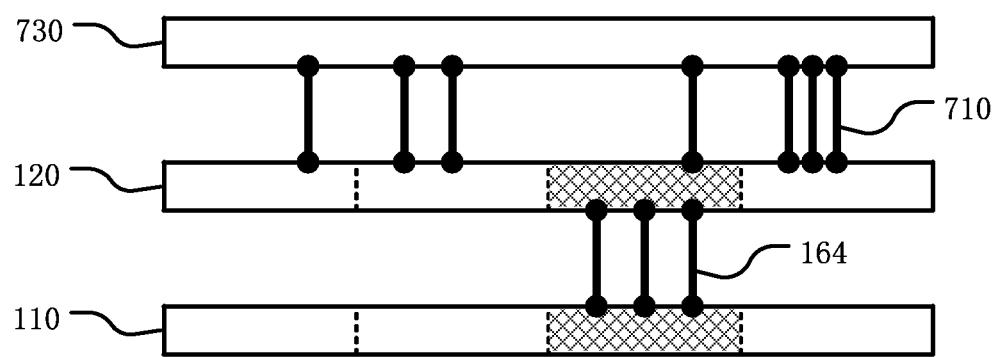
FIG. 7A is a side view of a stack including a peripheral-circuit level die, a page-buffer level die, and an array level die.

In some embodiments, the other peripheral circuitry 174 for the memory array 160 is formed in a peripheral-circuit level die disposed on top of the stack of page-buffer level die 120 and array level die 110 illustrated in FIG. 5B-5D. FIG. 7A is a side view of a stack including a peripheral-circuit level die 730, the page-buffer level die 120, and the array level die 110. As described earlier, data lines of a sub-array in the array level die 110 are coupled to the sub-array's corresponding page buffer in the page-buffer level die 120 with inter-die connectors 164. The other peripheral circuitry 174 for the memory array 160 is formed in the peripheral-circuit level die 730. Connection between the other peripheral circuitry 174 in the peripheral-circuit level die 730 and the sub-array page buffers 163 in the page-buffer level die 120 (lines 173 illustrated in FIG. 1) includes inter-die connectors 710. In some embodiments, the inter-die connectors 710 between the peripheral-circuit level die 730 and the page-buffer level die 120 comprises through silicon vias (TSVs).

Figure 7B:
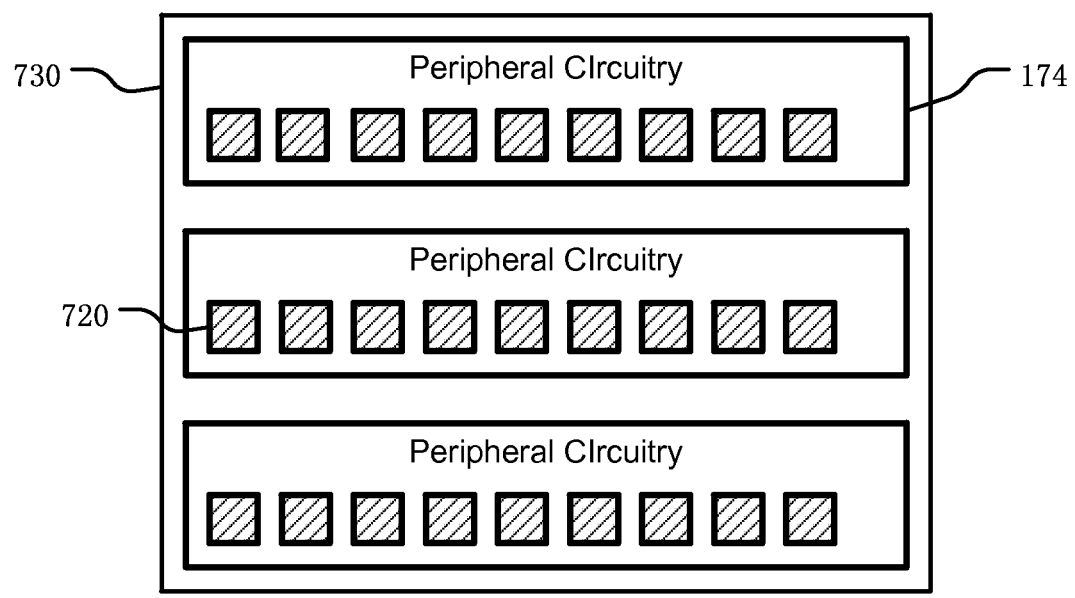
FIG. 7B is an example layout of the peripheral-circuit level die illustrated in FIG. 7A.

FIG. 7B is an example layout of the peripheral-circuit level die 730 illustrated in FIG. 7A. The peripheral-circuit die 730 includes the other peripheral circuitry 174 and contact pads 720 (shaded boxes). The contact pads 702 provides for connections (e.g., with bonding wires or C4 bumps) to circuitry external to the stack including the peripheral-circuit level die 730, the page-buffer level die 120, and the array level die 110 illustrated in FIG. 7A.

Figure 8A:
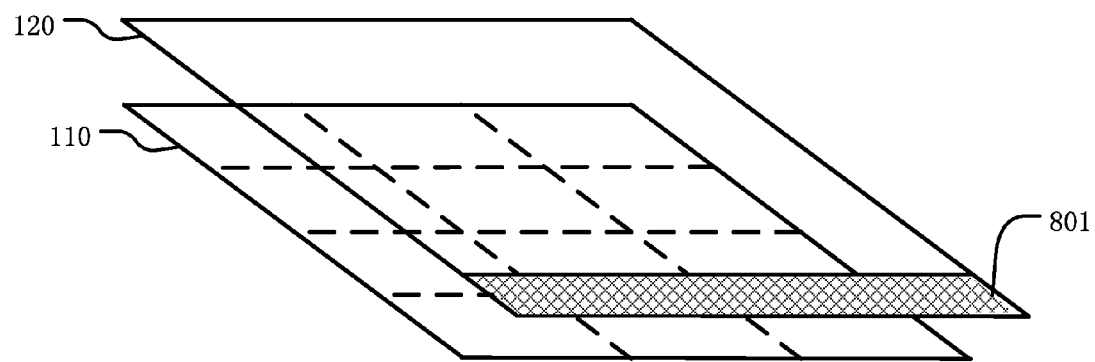
FIGS. 8A and 8B illustrate example locations of an address decoder.
Figure 8B:
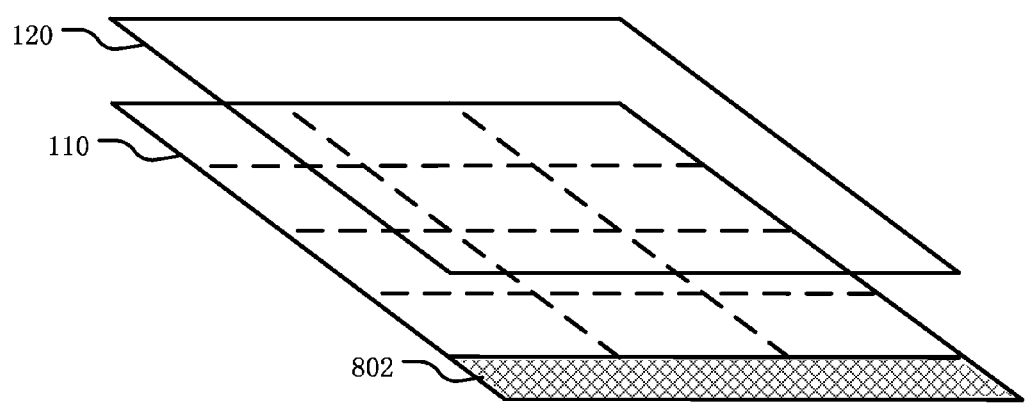

In order to enable dense memory array designs, the addresses decoder 161 can be located outside areas of the memory array 160 and the sub-array page buffers 163 illustrated in FIG. 1. FIGS. 8A and 8B illustrate example locations of the address decoder 161 in the present technology. FIGS. 8A and 8B shows the stack of page-buffer level die 120 and array level die 110 illustrated in FIG. 5B. As illustrated in FIG. 8A, the address decoder 161 can be formed in the page-buffer level die 120 in an area 801 that is adjacent to the area for the sub-array page buffers 163 of the memory array 160. In some embodiment, as illustrated in FIG. 8B, the address decoder 161 can be formed in the array-level die 110 in an area 802 that is adjacent to the sub-array areas of the sub-arrays of the memory array 160. The address decoder can be formed using transistors of a manufacturing process for other logic or analog circuits formed in the array level die 110 or in the page-buffer level die 120. In one embodiment, the address decoder 161 located in the array level die 110 (FIG. 8B) can be formed using transistors of a manufacturing process for the memory cells of the memory array 160 in the array level die 110.

Figure 9:
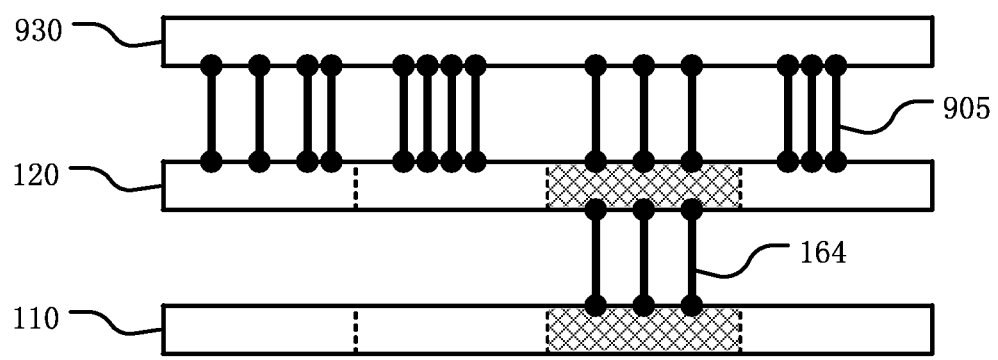
FIG. 9 is a side view of a stack including a third-level die, a page-buffer level die, and an array level die.

The memory 175 illustrated in FIG. 1 can also include a third-level die disposed on top of the stack of page-buffer level die 120 and array level die 110 illustrated in FIGS. 5B-5D. FIG. 9 is a side view of stack including a third-level die 930, the page-buffer level die 120, and the array level die 110. As described earlier, data lines of a sub-array in the array level die 110 are coupled to the sub-array's corresponding page buffer in the page-buffer level die 120 with inter-die connectors 164. Circuitry formed in the third-level die 930 is coupled to the sub-array page buffers in the page-buffer level die 120 via inter-die connectors 905. In another embodiment, circuitry in the third-level die 930 is coupled to the I/O circuits of the page-buffer level die 120 via inter-die connectors 905. In some embodiments, the inter-die connectors 905 comprise through silicon vias (TSVs).

The third-level die 930 can include a controller, a volatile memory device (e.g., DRAM, SRAM), or a general-purpose processor. For example, circuitry in the third-level die 930 can be configured to perform ECC functions on data to and from the sub-array page buffers 163 in the page-buffer level die 120. For another example, a volatile memory device in the third-level die 930 can be configured as a cache memory for data to and from the sub-array page buffers 163 in the page-buffer level die 120.

As each sub-array of the sub-arrays in the array level die 110 has its own corresponding sub-array page buffer in the page-buffer level die 120, the sub-arrays can be accessed in parallel or independently. The page buffer level die or the peripheral circuit level die can include multiplexing circuits, by which the array of sub-arrays on a device is logically partitioned in more than one logical partition. For example, a device may include 16 sub-arrays, each four bits wide, which can be operated in parallel as a single 64 bit page. Alternatively, the device can be partitioned into two sets of eight sub-arrays, which can be operated as two 32 bit pages. As the sub-arrays can be accessed independently, two or more sub-arrays can be divided into logical partitions, and operated for example using a standard redundancy technique such as a RAID data storage scheme that can divide and replicate data among multiple physical sets of sub-arrays. For example, a controller (e.g., state machine 169 illustrated in FIG. 1) of the memory device 175 can logically divide the sub-arrays into two partitions, for example, a first partition including the first half of the sub-arrays and a second partition including the second half of the sub-arrays. The controller maintains the two partitions as a RAID level-1 storage unit by copying (mirroring) data stored in the first partition to the second partition.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. An apparatus comprising:
   an array of memory cells in an array level die, the array of memory cells comprising a plurality of sub-arrays, each sub-array coupled to corresponding data lines;
   page buffers for corresponding sub-arrays in the plurality of sub-arrays, the page buffers being in a page-buffer level die; and
   inter-die connections that electrically couple the page buffers in the page-buffer level die to the data lines of corresponding sub-arrays in the array level die.

2. The apparatus of claim 1, including an array page width bus in the page-buffer level die, and wherein the page-buffer level die includes a number P of page buffers with corresponding sub-array page widths for corresponding sub-arrays, each coupled to a corresponding one of P sub-array page width segments of the array page width data bus in the page buffer level die.

3. The apparatus of claim 1, wherein the sub-arrays in plurality of sub-arrays are disposed within sub-array areas in respective locations in the array level die, and the inter-die connections to the page buffers in the page-buffer level die connect to the data lines at locations within the sub-array areas of the corresponding sub-arrays.

4. The apparatus of claim 1, including switches in the sub-arrays of the plurality of sub-arrays for selectively connecting bit lines in the sub-arrays to the data lines in the sub-arrays.

5. The apparatus of claim 1, including wherein bit lines in the sub-array are connected to the data lines in the sub-arrays.

6. The apparatus of claim 1 further comprising peripheral circuitry and contact pads in the page-buffer level die.

7. The apparatus of claim 1 further comprising peripheral circuitry and contact pads in a peripheral-circuit level die.

8. The apparatus of claim 1 further comprising an address decoder in the array level die.

9. The apparatus of claim 8, wherein the memory cells and the address decoder are formed using thin-film transistors.

10. The apparatus of claim 1 further comprising an address decoder in the page-buffer level die.

11. The apparatus of claim 1 further comprising a third level die; and inter-die connections that electrically couple the page buffers in the page-buffer level die to circuitry in the third level die.

12. The apparatus of claim 11, wherein the circuitry in the third level die comprises a controller, a volatile memory device, or a general-purpose processor.

13. The apparatus of claim 11, wherein the circuitry in the third level die is configured to perform one or more error-correcting code (ECC) functions.

14. The apparatus of claim 1, wherein two or more of the sub-arrays of memory cells are configured as a RAID storage array.

15. The apparatus of claim 1, wherein the array of memory cells comprises three-dimensional vertical-gate NAND memory cells or three-dimensional vertical-channel NAND memory cells.

16. The apparatus of claim 1, wherein the inter-die connections comprise through silicon vias (TSVs).

* * * * *